| (12) | United States Patent | (10) Patent No.: | US 9,379,044 B2 |
|---|---|---|---|
| | Lim et al. | (45) Date of Patent: | Jun. 28, 2016 |

(54) PACKAGE CARRIER, PACKAGE CARRIER MANUFACTURING METHOD, PACKAGE STRUCTURE FOR SEMICONDUCTOR DEVICE AND MANUFACTURING METHOD THEREOF

(71) Applicant: ADVANPACK SOLUTIONS PTE LTD., Singapore (SG)

(72) Inventors: Shoa-Siong Raymond Lim, Singapore (SG); Hwee-Seng Jimmy Chew, Singapore (SG)

(73) Assignee: ADVANPACK SOLUTIONS PTE LTD., Singapore (SG)

( * ) Notice: Subject to any disclaimer, the term of this patent is extended or adjusted under 35 U.S.C. 154(b) by 128 days.

(21) Appl. No.: 13/656,703

(22) Filed: Oct. 20, 2012

(65) Prior Publication Data

US 2013/0113099 A1    May 9, 2013

Related U.S. Application Data

(60) Provisional application No. 61/549,258, filed on Oct. 20, 2011.

(51) Int. Cl.
   *H01L 23/48* (2006.01)
   *H01L 23/488* (2006.01)
   (Continued)

(52) U.S. Cl.
   CPC .............. *H01L 23/488* (2013.01); *H01L 21/56* (2013.01); *H01L 21/768* (2013.01);
   (Continued)

(58) Field of Classification Search
   CPC ............ H01L 23/488; H01L 23/49861; H01L 21/768; H01L 21/56; H01L 24/97
   USPC .......................... 257/690, 738, 773, 774, 778
   See application file for complete search history.

(56) References Cited

U.S. PATENT DOCUMENTS 5,169,680 A * 12/1992 Ting et al. ...................... 438/629
5,877,559 A *  3/1999 Takayama et al. ............ 257/773
(Continued)

FOREIGN PATENT DOCUMENTS

| CN | 100437987 C | 11/2008 |
|---|---|---|
| CN | 100438007 C | 11/2008 |

(Continued)

OTHER PUBLICATIONS

Office Action issued for U.S. Appl. No. 13/689,207.
(Continued)

*Primary Examiner* — Hung Vu
(74) *Attorney, Agent, or Firm* — Rabin & Berdo, P.C.

(57) ABSTRACT

A package substrate including a dielectric layer, a first conductive layer, a second conductive layer and a bonding pad is provided. The dielectric layer has a top surface and a bottom surface. The first conductive layer is embedded into the dielectric layer, and a first surface of the first conductive layer is exposed from the top surface and has the same plane with the top surface. The second conductive layer is embedded into the dielectric layer and contacts the first conductive layer, and a second surface of the second conductive layer is exposed from the bottom surface and has the same plane with the bottom surface. The bonding pad is partially or completely embedded into the first conductive layer and the dielectric layer, so that the periphery of the bonding pad is confined within a cavity by the sidewalls of both the first conductive layer and the dielectric layer.

19 Claims, 13 Drawing Sheets

(51) Int. Cl.
*H01L 21/56* (2006.01)
*H01L 21/768* (2006.01)
*H01L 23/00* (2006.01)
H01L 23/31 (2006.01)
H01L 23/498 (2006.01)

(52) U.S. Cl.
CPC ......... *H01L 23/49861* (2013.01); *H01L 24/97* (2013.01); *H01L 21/561* (2013.01); *H01L 23/3128* (2013.01); *H01L 23/49816* (2013.01); *H01L 2224/16225* (2013.01); *H01L 2224/32225* (2013.01); *H01L 2224/73204* (2013.01); *H01L 2224/97* (2013.01); *H01L 2924/07802* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 5,877,599 A | 3/1999 | Hojabri | |
| 7,239,025 B2 * | 7/2007 | Farrar | 257/779 |
| 7,474,538 B2 | 1/2009 | Kikuchi et al. | |
| 7,566,834 B2 * | 7/2009 | Shimoto et al. | 174/258 |
| 8,865,525 B2 | 10/2014 | Lin et al. | |
| 8,866,301 B2 | 10/2014 | Lin et al. | |
| 2003/0057568 A1 | 3/2003 | Miyazaki | |
| 2005/0088833 A1 | 4/2005 | Kikuchi et al. | |
| 2006/0192287 A1 | 8/2006 | Ogawa et al. | |
| 2008/0111233 A1 * | 5/2008 | Pendse | 257/712 |
| 2008/0145967 A1 | 6/2008 | Chew et al. | |
| 2009/0046441 A1 | 2/2009 | Funaya et al. | |
| 2009/0261466 A1 * | 10/2009 | Pagaila et al. | 257/686 |
| 2009/0291530 A1 | 11/2009 | Jimmy et al. | |
| 2011/0084385 A1 * | 4/2011 | Itaya et al. | 257/737 |
| 2011/0210442 A1 | 9/2011 | Lim et al. | |
| 2012/0153463 A1 | 6/2012 | Maeda | |
| 2012/0153466 A1 | 6/2012 | Chew et al. | |
| 2013/0020710 A1 | 1/2013 | Chew et al. | |
| 2013/0175707 A1 | 7/2013 | Chew et al. | |

FOREIGN PATENT DOCUMENTS

| | | |
|---|---|---|
| CN | 102044515 A | 5/2011 |
| CN | 102132404 A | 7/2011 |
| JP | 2008-153622 A | 7/2008 |
| KR | 10-2006-0101716 A | 9/2006 |
| TW | 200639993 | 11/2006 |
| TW | M322059 U | 11/2007 |
| TW | 200908262 A | 2/2009 |
| TW | 201113999 A | 4/2011 |

OTHER PUBLICATIONS

USPTO Office Action dated Jun. 26, 2015 in U.S. Appl. No. 13/689,207.
USPTO-provided Translation of Chinese Office Action dated Jan. 21, 2015.
Chinese Office Action dated Sep. 9, 2015.
Chinese Office Action dated Aug. 10, 2015.

* cited by examiner

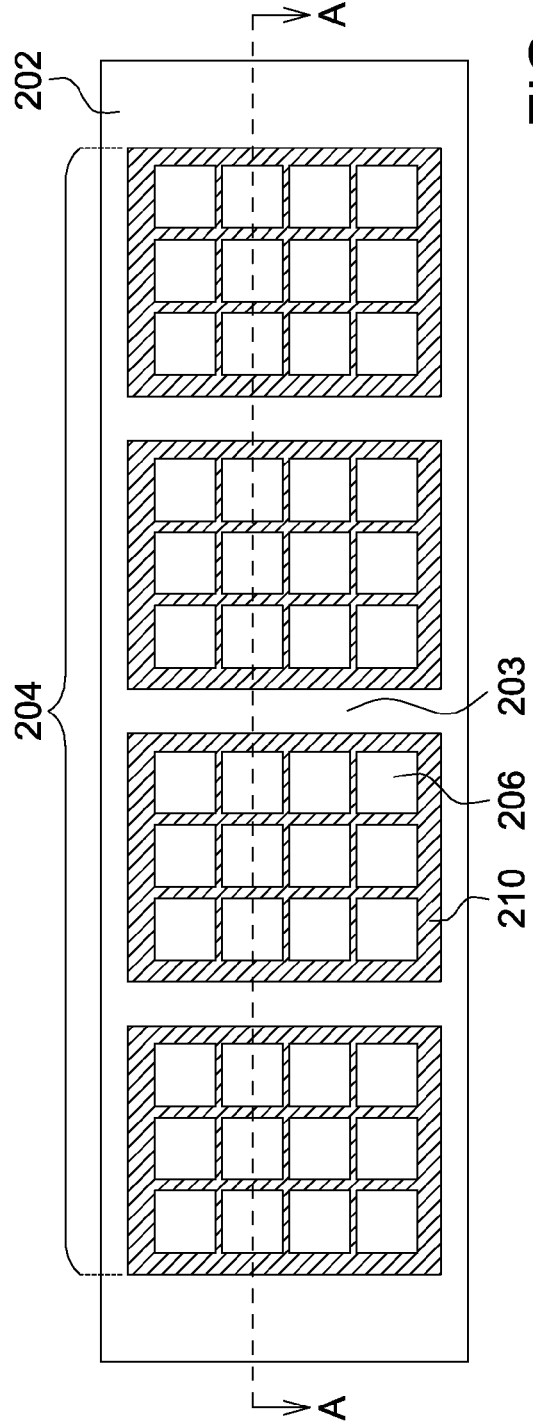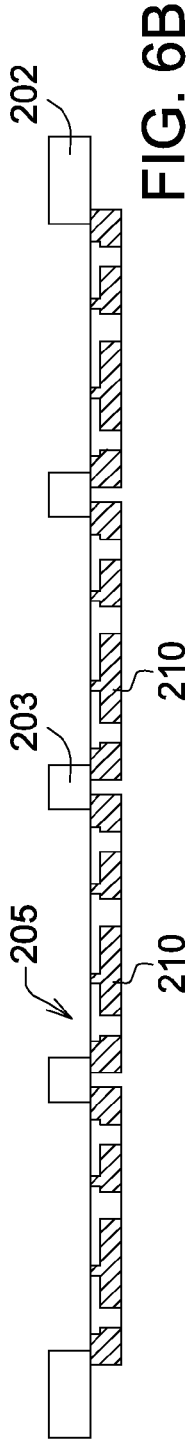

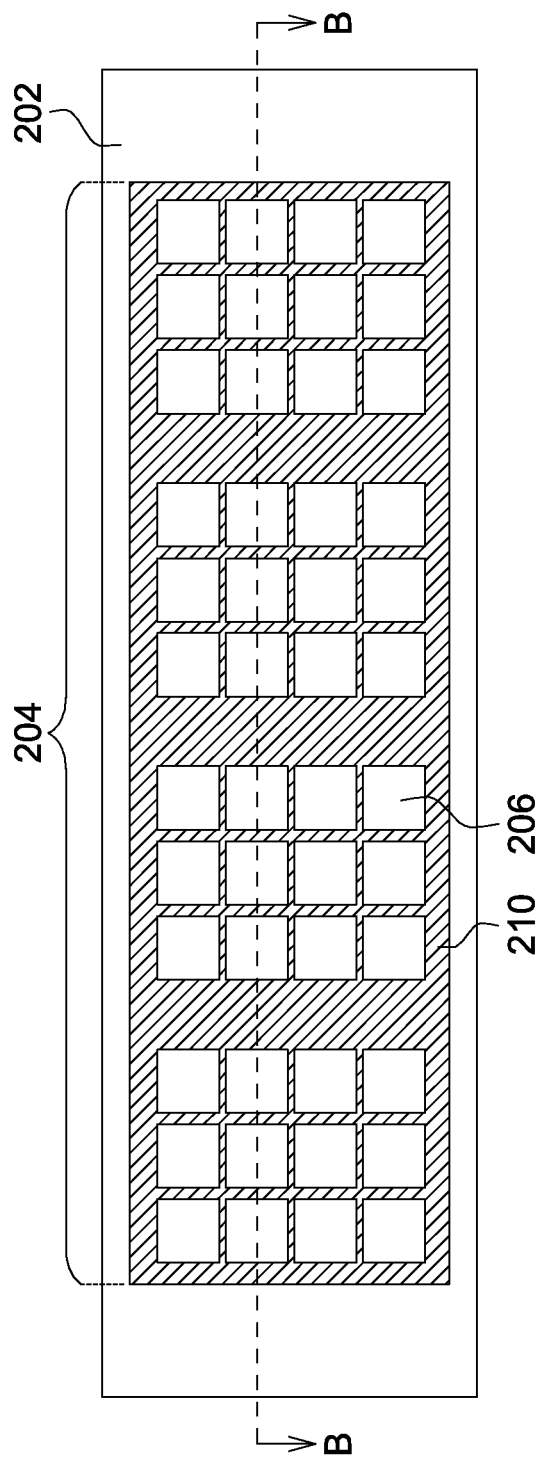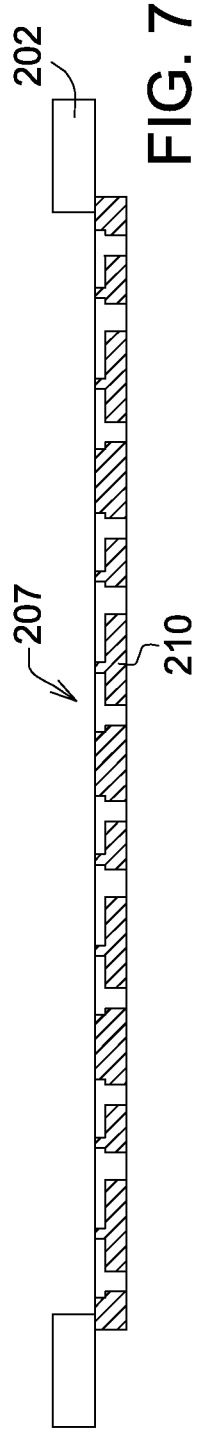

PACKAGE CARRIER, PACKAGE CARRIER MANUFACTURING METHOD, PACKAGE STRUCTURE FOR SEMICONDUCTOR DEVICE AND MANUFACTURING METHOD THEREOF

This application claims the benefit of U.S. provisional application Ser. No. 61/549,258, filed Oct. 20, 2011, the disclosure of which is incorporated by reference herein in its entirety.

TECHNICAL FIELD

The disclosure relates in general to a package structure and manufacturing method, and more particularly to a package substrate, a manufacturing method of the package substrate, a package structure for a semiconductor device and a manufacturing method thereof.

BACKGROUND

Along with the popularity of electronic products in people's daily life, the demand for semiconductor devices is increasing. As the design of semiconductor device is directed towards thinness, when the semiconductor device is downsized, the quantity of I/O pins increases, not decreases, making the pitch/width of the wire further decreased and directed towards the design of fine pitch such as 50 μm or even below 35 μm.

However, during the process of bonding the semiconductor device to a package substrate by way of flip-chip assembly, short-circuit may be occurred due to the bridging between two adjacent conductive bumps when the solder is reflowed at a high temperature. In addition, when the solder is not confined by a solder mask which restricts its flow on the wire layer, the solder reflowed at a high temperature may be easily overspread along the wire layer, hence reducing the height between the flipped semiconductor device and the package substrate. As the height is decreased, it will be harder for the underfill layer to be interposed into the gap between the semiconductor device and the package substrate, and the reliability of the package will therefore deteriorate.

SUMMARY

The disclosure is directed to a package substrate, a manufacturing method of the package substrate, a package structure for a semiconductor device and a manufacturing method thereof capable of increasing the reliability for packaging the semiconductor device and conforming to the design of fine pitches.

According to one embodiment, a package substrate comprising a dielectric layer, a first conductive layer and a second conductive layer is provided. The dielectric layer has a top surface and a bottom surface. The first conductive layer is embedded into the dielectric layer, and a first surface is exposed from the top surface and further has the same plane with the top surface or is concaved to the top surface. The second conductive layer is embedded into the dielectric layer and contacts the first conductive layer, and a second surface is exposed from the bottom surface and further has the same plane with the bottom surface or is concaved to bottom surface.

According to another embodiment, a manufacturing method of a package substrate comprising the following steps is provided. A conductive substrate is provided. A first photoresist layer is formed on the conductive substrate, wherein the first photoresist layer is patterned to form several first openings exposing a portion of the conductive substrate. A first conductive layer is formed in the first openings. A second photoresist layer is formed on the first photoresist layer and the first conductive layer, wherein the second photoresist layer is patterned to form several second openings exposing a portion of the first conductive layer. A second conductive layer contacting the first conductive layer is formed in the second openings. The first and the second photoresist layer are removed. A dielectric layer is formed on the conductive substrate, wherein the dielectric layer covers the first conductive layer, the second conductive layer and a portion of the conductive substrate. A portion of the dielectric layer is removed, and a surface of the second conductive layer is exposed from the bottom surface of the dielectric layer and has the same plane with the bottom surface of the dielectric layer. A third photoresist layer is formed on the conductive substrate and the dielectric layer, wherein the third photoresist layer is patterned to form a third opening exposing a portion of the conductive substrate. A portion of the conductive substrate is removed to form a fourth opening, and a surface of the first conductive layer and the top surface of the dielectric layer are exposed in the fourth opening and the surface of the first conductive layer has the same plane with the top surface of the dielectric layer. The third photoresist layer is removed. A fourth photoresist layer is formed on the conductive substrate, the dielectric layer, the first conductive layer and the second conductive layer, wherein the fourth photoresist layer is patterned to form a fifth opening exposing a portion of the surface of the first conductive layer. A bonding pad is formed in the fifth opening. The fourth photoresist layer is removed. Besides, a welding layer covering the surface of the second conductive layer is further formed on the second conductive layer.

According to an alternate embodiment, a package structure for a semiconductor device is provided. The package structure comprises a package substrate, a semiconductor device, an underfill layer and a sealant layer. The package substrate comprises a dielectric layer, a first conductive layer and a second conductive layer. The dielectric layer has a top surface and a bottom surface. The first conductive layer is embedded into the dielectric layer, and a first surface is exposed from the top surface and has the same plane with the top surface or is concaved to the top surface. The second conductive layer is embedded into the dielectric layer and contacts the first conductive layer, and a second surface is exposed from the bottom surface and has the same plane with the bottom surface or is concaved to the bottom surface. The semiconductor device having a conductive bump is disposed on the package substrate. The conductive bumps are supported between the semiconductor device and the package substrate.

According to another alternate embodiment, a package manufacturing method for a semiconductor device is provided. The method comprises the following steps. A conductive substrate is provided. A first photoresist layer is formed on the conductive substrate, wherein the conductive substrate is patterned to form several first openings exposing a portion of the conductive substrate. A first conductive layer is formed in the first openings. A second photoresist layer is formed on the first photoresist layer and the first conductive layer, wherein the second photoresist layer is patterned to form several second openings exposing a portion of the first conductive layer. A second conductive layer contacting the first conductive layer is formed on the second openings. The first and the second photoresist layer are removed. A dielectric layer is formed on the conductive substrate, wherein the dielectric layer covers the first conductive layer, the second conductive layer and a portion of the conductive substrate. A portion of the dielectric layer is removed, and a surface of the second conductive layer is exposed from the bottom surface of the dielectric layer and has the same plane with the bottom surface of the dielectric layer. A third photoresist layer is formed on the conductive substrate, the dielectric layer, the first conductive layer and the second conductive layer, wherein the third photoresist layer is patterned to form a third opening exposing a portion of the conductive substrate. A portion of the conductive substrate is removed to form a fourth opening, and a surface of the first conductive layer and the top surface of the dielectric layer are exposed in the fourth opening and the surface of the first conductive layer has the same plane with the top surface of the dielectric layer. The third photoresist layer is removed. A fourth photoresist layer is formed on the conductive substrate, the dielectric layer, the first conductive layer and the second conductive layer, wherein the fourth photoresist layer is patterned to form a fifth opening exposing a portion of the surface of the first conductive layer. A bonding pad is formed in the fifth opening. The fourth photoresist layer is removed. A welding layer covering the surface of the second conductive layer is formed on the second conductive layer to form a package substrate composed of the dielectric layer, the first conductive layer, the second conductive layer and the bonding pad. A semiconductor device is disposed on the package substrate, wherein the semiconductor device has a conductive bump connected to the bonding pad and supported between the semiconductor device and the package substrate.

The above and other aspects of the disclosure will become better understood with regard to the following detailed description of the non-limiting embodiments. The following description is made with reference to the accompanying drawings.

BRIEF DESCRIPTION OF THE DRAWINGS

FIGS. 6A and 6B respectively are a top view of a package substrate and a cross-sectional view along a cross-sectional line A-A according to an embodiment of the invention;

FIGS. 7A and 7B respectively are a top view of a package substrate and a cross-sectional view along a cross-sectional line B-B according to another embodiment of the invention.

Figure 1A:
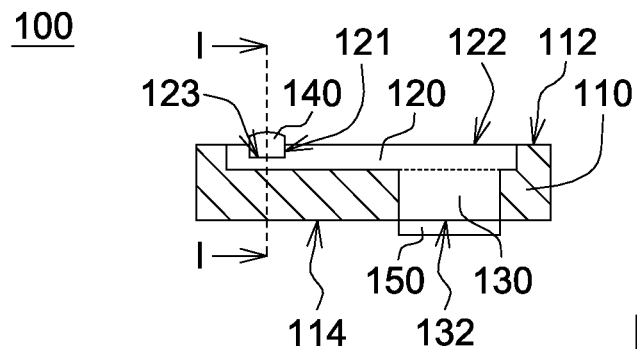
FIGS. 1A and 1B respectively are a schematic diagram of a package substrate and a cross-sectional view along a cross-sectional line I-I according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The package substrate, the manufacturing method of the package substrate, the package structure for a semiconductor device and the manufacturing method thereof disclosed in the present embodiment can be used in a package structure having a larger quantity of I/O pins without using a solder mask to cover the surface of the package substrate to avoid short-circuit due to solder bridging, such that fine pitch precision between the wires still can be sustainable. Preferably, the solder can be confined to be within a predetermined cavity and cannot flow outside the cavity, the height of the interconnection wire structure in the package substrate can be reduced through the arrangement of top-down stacked conductor layers. Furthermore, by surrounding the package substrate with an annular reinforcing structure, the strength of the package is enhanced, warpage or deformation of the package is avoided, and the package reliability of the semiconductor device is thus improved.

A number of embodiments are disclosed below for elaborating the invention. However, the embodiments of the invention are for detailed descriptions only, not for limiting the scope of protection of the invention.

Figure 1B:
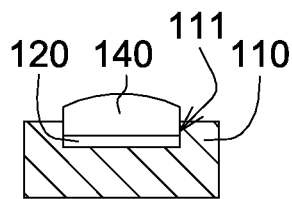
Figure 2A:
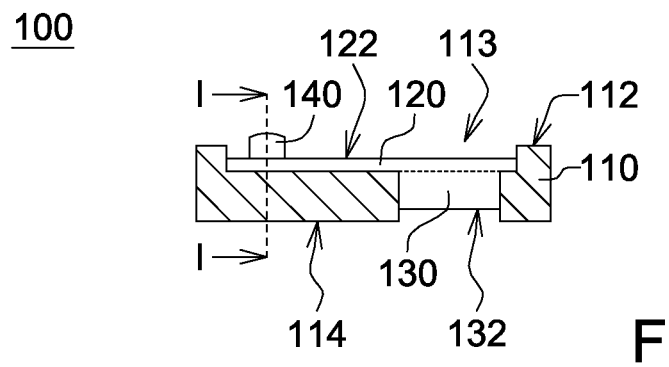
FIGS. 2A and 2B respectively are a schematic diagram of a package substrate and a cross-sectional view along a cross-sectional line I-I according to an embodiment of the invention.
Figure 2B:
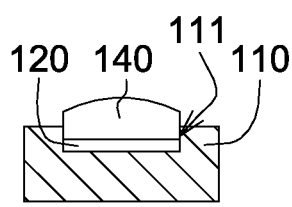
Figure 3A:
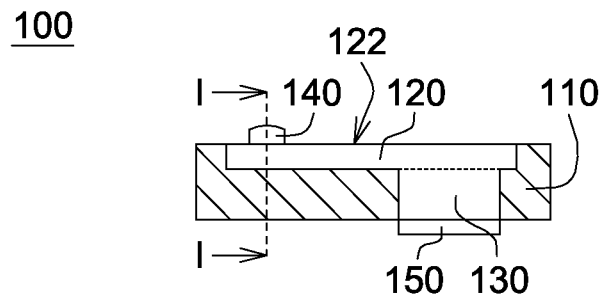
FIGS. 3A and 3B respectively are a schematic diagram of a package substrate and a cross-sectional view along a cross-sectional line I-I according to an embodiment of the invention.
Figure 3B:
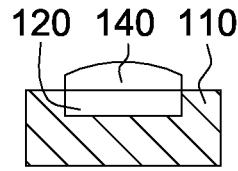

FIGS. 1A and 1B respectively are a schematic diagram of a package substrate and a cross-sectional view along a cross-sectional line I-I according to an embodiment of the invention. FIGS. 2A and 2B respectively are a schematic diagram of a package substrate and a cross-sectional view along a cross-sectional line I-I according to an embodiment of the invention. FIGS. 3A and 3B respectively are a schematic diagram of a package substrate and a cross-sectional view along a cross-sectional line I-I according to an embodiment of the invention.

Referring to FIGS. 1A and 1B, the package substrate 100 comprises a dielectric layer 110, a first conductive layer 120, a second conductive layer 130, a bonding pad 140 and a welding layer 150. The dielectric layer 110 has a top surface 112 and a bottom surface 114. The first conductive layer 120 is embedded into the dielectric layer 110, and a first surface 122 is exposed from the top surface 112. The second conductive layer 130 is embedded into the dielectric layer 110, and a second surface 132 is exposed from the bottom surface 114. The bonding pad 140 is disposed within a cavity 123 defined by a side wall 121 of the first conductive layer 120 and a side wall 111 of the dielectric layer 110 (referring to FIG. 1B). When the first surface 122 has the same plane with the top surface 112, the bonding pad 140 is partially (or completely) embedded into the first conductive layer 120 and the dielectric layer 110, so that the peripheral of the bonding pad 140 is confined within a cavity 123 by both the side wall 121 of the first conductive layer 120 and the side wall 111 of the dielectric layer 110 (FIG. 1B) and cannot move around to avoid short-circuit due to the bridging of the bonding pad 140 (such as the solder) when the solder is reflowed at a high temperature. The bonding pad 140 is formed by a material selected from tin (Sn), copper (Cu), silver (Ag), nickel (Ni), palladium (Pd), gold (Au), or a combination thereof, and preferably is a reflowable solder material.

As indicated in FIG. 1A, the first surface 122 has the same plane with the top surface 112 of the dielectric layer 110, and the second surface 132 further has the same plane with the bottom surface 114 of the dielectric layer 110. As indicated in FIG. 2A, the first surface 122 is concaved to the top surface 112 of the dielectric layer 110, and the second surface 132 is concaved to the bottom surface 114 of the dielectric layer 110. When the first surface 122 is concaved to the top surface 112 of the dielectric layer 110, the bonding pad 140 is partially (or completely) embedded into the cavity 113 of the dielectric layer 110, so that two opposite sides of the bonding pad 140 are confined within a cavity 113 by the side wall 111 of the dielectric layer 110 alone and cannot move around (referring to FIG. 2B) to avoid short-circuit due to the bridging of the bonding pad 140 (such as the solder) when the solder is reflowed at a high temperature. Moreover, when the second surface 132 is concaved to the bottom surface 114 (referring to FIG. 2A), a solder ball 190 (referring to FIG. 4A) can be fixed on each welding layer 150, so that the quality of ball implantation is further stabilized.

Next, referring to FIGS. 3A and 3B, given that the solder will not be short-circuited, the bonding pad 140 can be directly formed on the first surface 122 of the first conductive layer 120. The first conductive layer 120 can be formed by an anti-erosion material such as nickel-copper alloy, nickel-chromium alloy and so on. The bonding pad 140 is formed by a material selected from tin (Sn), copper (Cu), silver (Ag), nickel (Ni), palladium (Pd), gold (Au), or a combination thereof, and preferably is formed by a bump not requiring reflowing such as a stud bump.

Figure 4A:
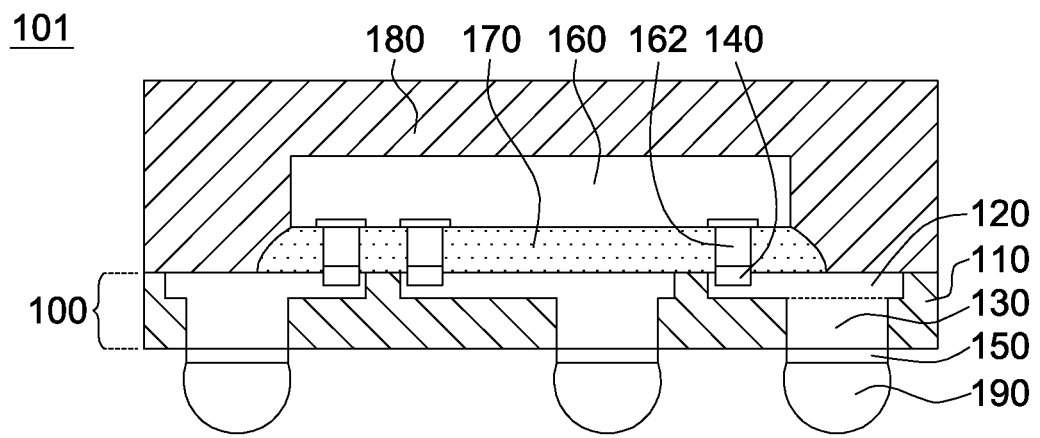
FIGS. 4A~4C are schematic diagrams of a package structure for a semiconductor device according to an embodiment of the invention.
Figure 4B:
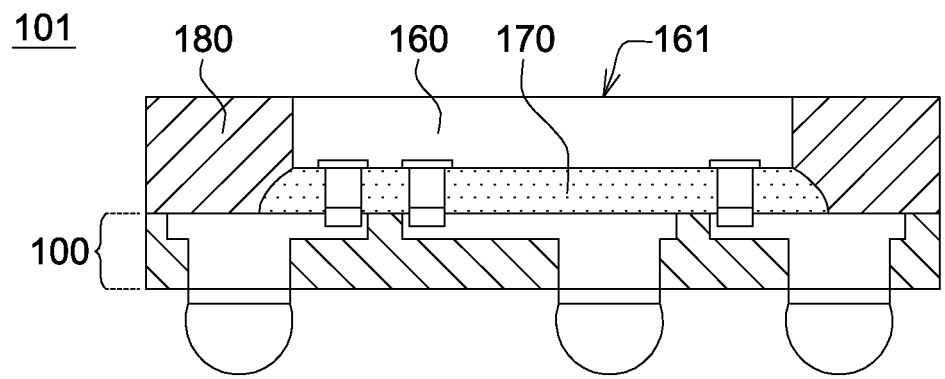
Figure 4C:
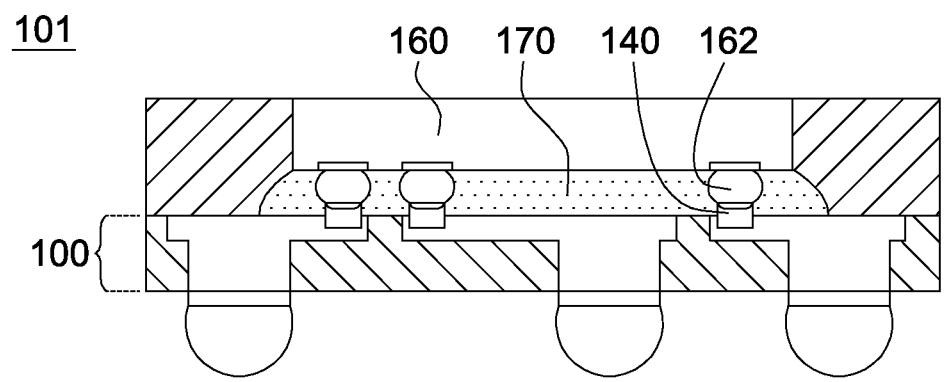

Referring to FIGS. 4A~4C, schematic diagrams of a package structure for a semiconductor device according to an embodiment of the invention are shown. As indicated in FIGS. 4A~4C, the package substrate can be any of the package substrates 100 used in FIGS. 1A, 2A and 3A. Detailed descriptions of the package substrate are already disclosed above and the similarities are not repeated here. As indicated in FIGS. 4A~4C, the semiconductor device 160 is disposed on the package substrate 100. The semiconductor device 160 has several conductive bumps 162, and only three conductive bumps 162 are illustrated in the diagram, wherein one conductive bump 162 is correspondingly connected to one bonding pad 140, and the conductive bumps 162 are supported between the semiconductor device 160 and the package substrate 100. In comparison to the bonding pad 140, the conductive bumps 162 have a higher melting point, therefore when the bonding pad 140 is heated and melted, the non-melted conductive bumps 162 have a sufficient height to support the semiconductor device 160 and maintain a suitable pitch between the semiconductor device 160 and the package substrate 100. The conductive bumps 162, such as electroplated copper columns, have a predetermined height. The bonding pad 140 is such as a solder. When the conductive bumps 162 is connected to the bonding pad 140 as indicated in FIGS. 1A and 2A, the bonding pad 140 preferably is confined within a cavity 123 and cannot flow around to avoid short-circuit due to the bridging of the bonding pad 140 when the bonding pad 140 is reflowed at a high temperature. Besides, the conductive bump 162 may further comprise a solder pad disposed on the copper column, wherein a portion of the solder pad is adhered on the bonding pad 140.

Besides, the underfill layer 170 encapsulates the peripheral of the conductive bumps 162, and is preferably formed by a thermal setting epoxy resin. The underfill layer 170, having the advantages of fast fluidity and quick curability, can be cured in the reflowing process, so that the bonding pad 140 is not affected by the fluidity of the underfill layer 170 and still maintains the conductivity between the conductive bumps 162 and the bonding pad 140. In addition, the sealant layer 180, which encapsulates the peripheral of the semiconductor device 160 and the underfill layer 170 and is preferably formed by a thermal setting epoxy resin, protects the semiconductor device 160. Moreover, several solder balls 190 are formed on the welding layer 150, and only three solder balls 190 are illustrated, wherein one solder ball 190 is correspondingly connected to one welding layer 150, and the solder balls 190 can be formed by a leadless solder paste or a lead solder paste.

As indicated in FIG. 4B, the sealant layer 180 encapsulates the peripheral of the semiconductor device 160 and the underfill layer 170, and the top surface 112 of the semiconductor device 160 is exposed. The sealant layer 180 preferably formed by transfer molding is cured by way of high temperature baking process.

As indicated in FIG. 4C, the conductive bumps 162, such as stud bumps, are preferably formed by copper or gold. The tip of the conductive bump 162 may pass through the underfill layer 170 having lower fluidity to be electrically connected to the bonding pad 140 disposed under the underfill layer 170. The underfill layer 170, which can be formed by a thermal setting non-conductive adhesive, encapsulates the peripheral of the conductive bumps 162.

In another embodiment, no bonding pad is disposed on the package substrate 100. The conductive bump 162 comprises a copper column and a solder pad disposed on the copper column, wherein a portion of the solder pad is directly adhered on the first conductive layer 120, so that the semiconductor device 160 is formed on the semiconductor substrate. When the conductive bumps 162 are connected to the first conductive layer 120, the conductive bumps 162 preferably are confined within the side wall of the dielectric layer 110 and cannot flow around. With a surface of the first conductive layer 120 being concaved to a top surface of the dielectric layer 110, the conductive bumps 162 are confined, and can thus be accurately positioned on the first conductive layer 120.

In the embodiments disclosed above, the design of a surface of the first conductive layer 120 being concaved to a top surface of the dielectric layer 110 prolongs the path of two adjacent first conductive layers spreading along the outer surface of the package body, hence avoiding the risk of two adjacent first conductive layers being short-circuited when electro migration occurs.

Figure 5A:
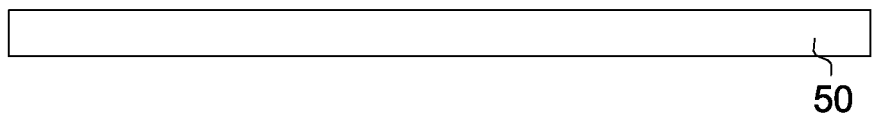
FIGS. 5A~5S are schematic diagrams of a manufacturing method of a package substrate according to an embodiment of the invention.
Figure 5B:
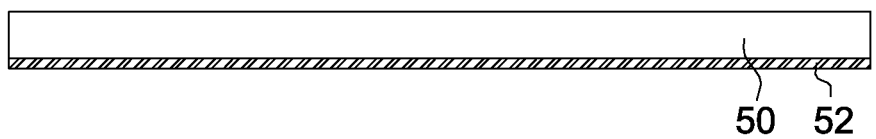
FIGS. 5T~5Y are schematic diagrams of a manufacturing method for a semiconductor device according to an embodiment of the invention.
Figure 5C:
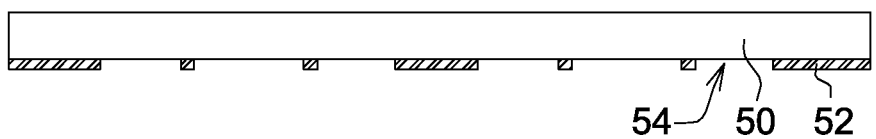
Figure 5D:
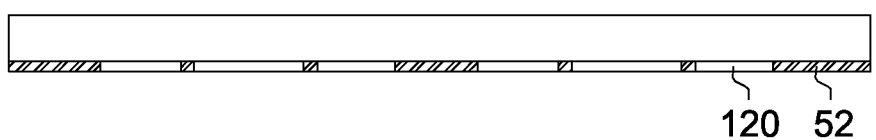
Figure 5E:
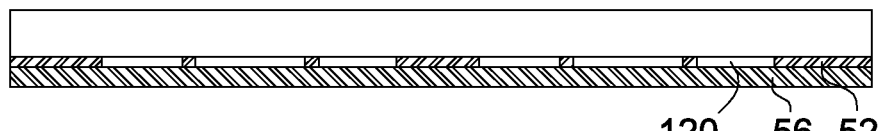
Figure 5F:
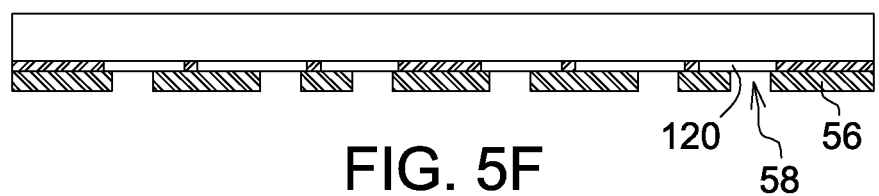
Figure 5G:
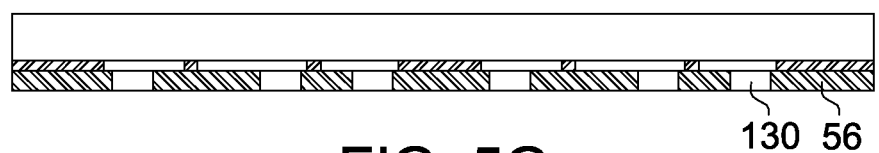
Figure 5H:
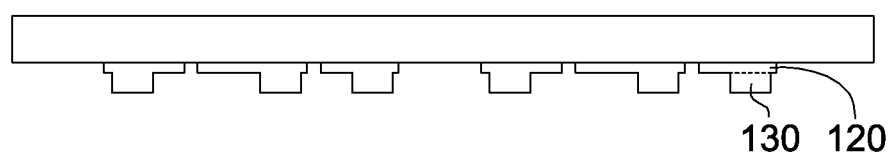
Figure 5I:
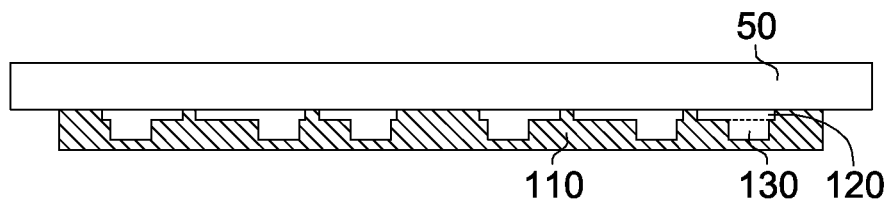
Figure 5J:
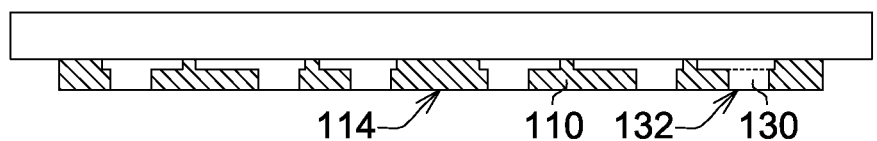
Figure 5K:
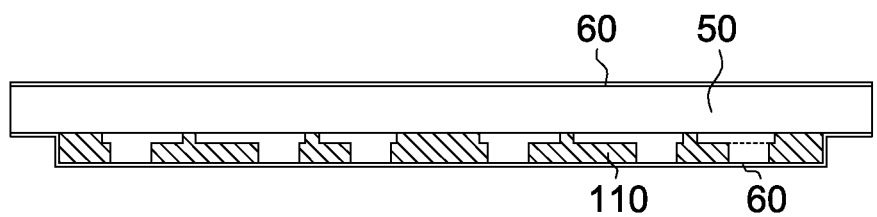
Figure 5L:
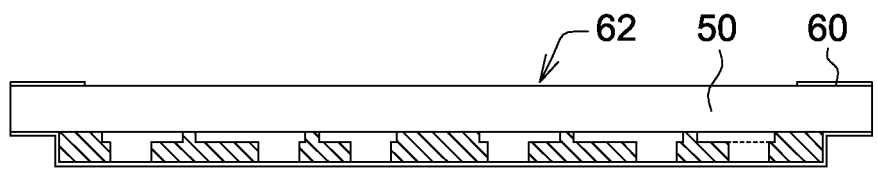
Figure 5M:
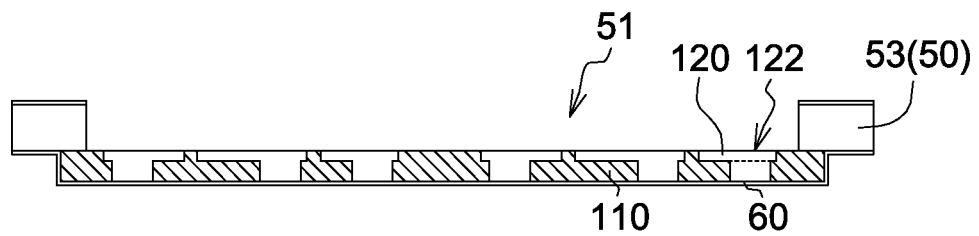
Figure 5N:
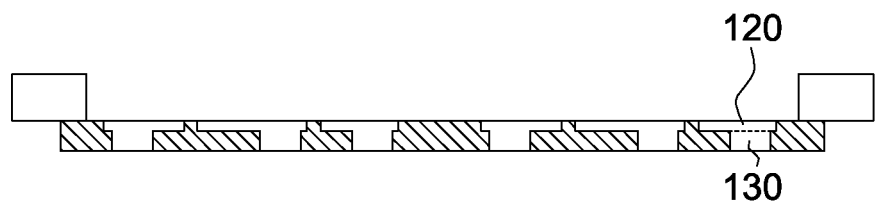
Figure 5O:
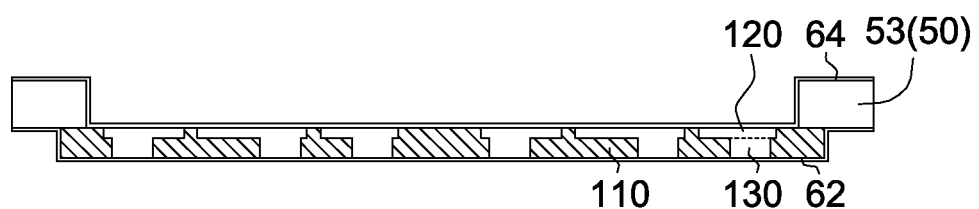
Figure 5P:
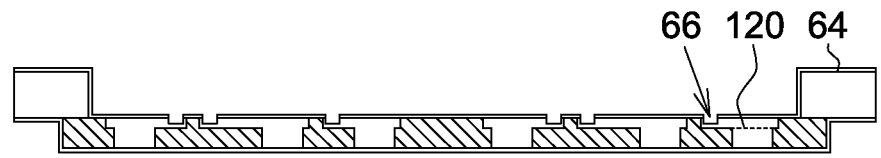
Figure 5Q:
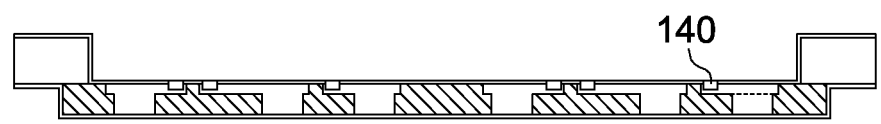
Figure 5R:
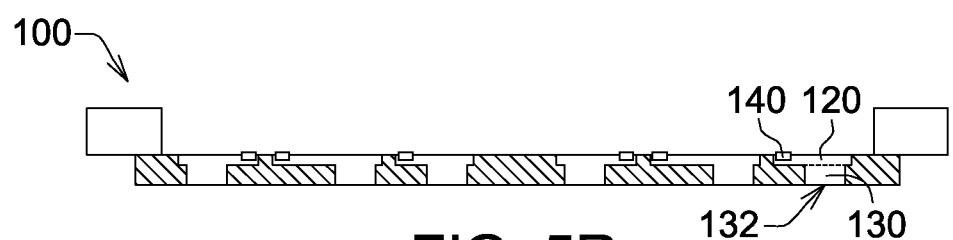
Figure 5S:
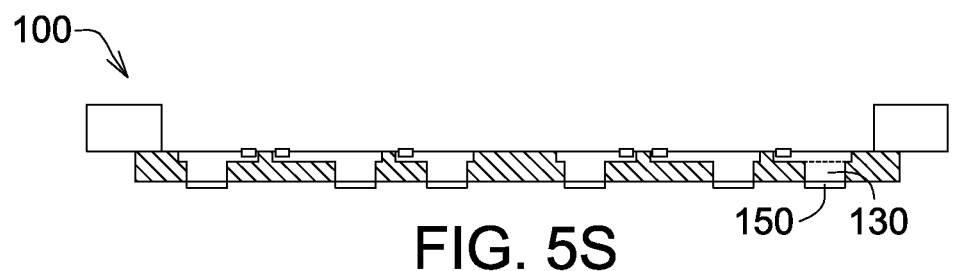
Figure 5T:
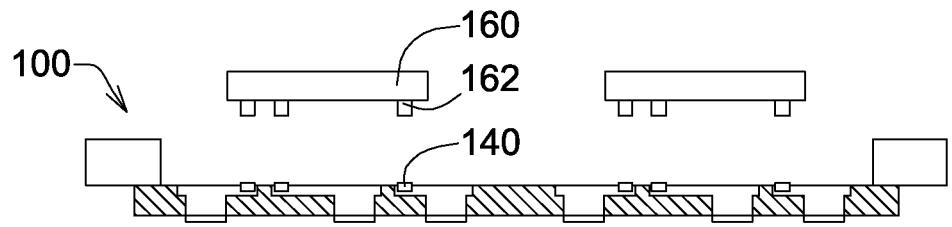
Figure 5U:
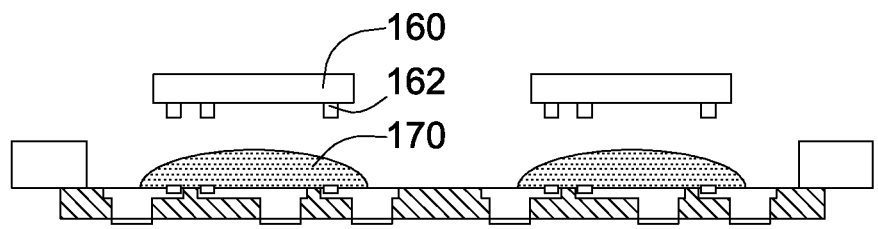
Figure 5V:
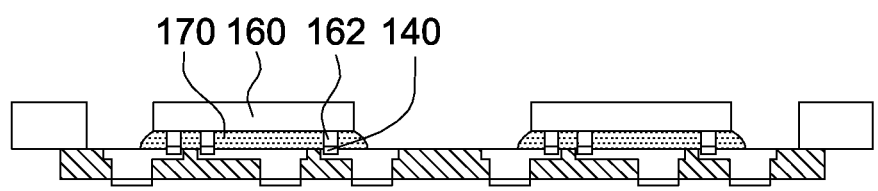
Figure 5W:
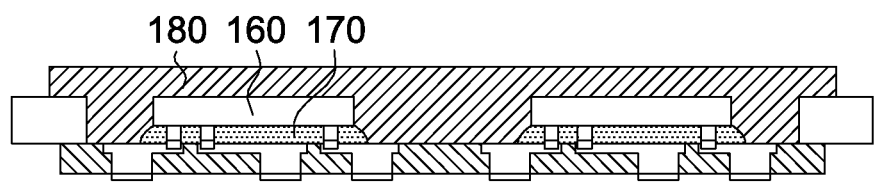
Figure 5X:
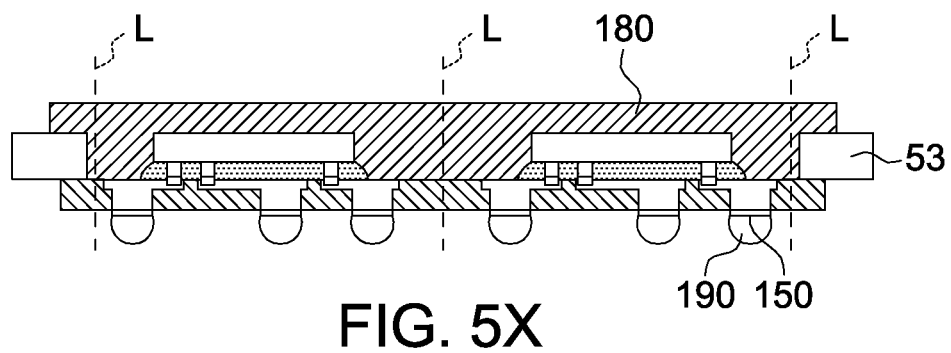
Figure 5Y:
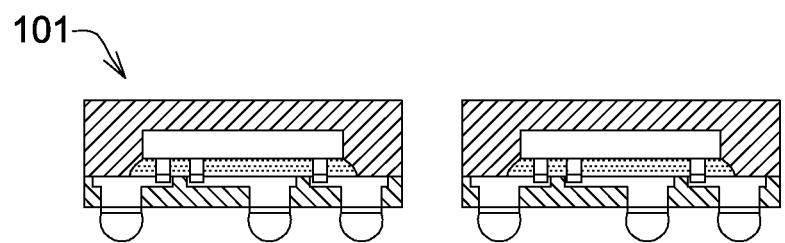

Referring to FIGS. 5A~5Y. FIGS. 5A~5S are schematic diagrams of a manufacturing method of package substrate according to an embodiment of the invention. FIGS. 5T~5Y are schematic diagrams of a manufacturing method for a semiconductor element according to an embodiment of the invention. Firstly, referring to FIGS. 5A~5D, a conductive substrate 50 is provided, and a first photoresist layer 52 is formed on the conductive substrate 50 and is patterned to form several first openings 54 exposing a portion of the conductive substrate 50. Then, a first conductive layer 120 is formed in the first openings 54. As indicated in FIG. 5A, the conductive substrate 50 is a metal substrate preferably formed by a copper board or a steel board electroplated with a copper layer. As indicated in FIGS. 5B and 5C, the first photoresist layer 52 is formed on the conductive substrate 50 by way of spin coating, and is further patterned by processes such as baking, exposure, and development, so that the first photoresist layer 52 has several first openings 54. As indicated in FIG. 5D, the first conductive layer 120 formed in the first openings 54 by way of electroplating is preferably formed by copper, nickel, gold or a combination thereof.

Next, referring to FIGS. 5E~5H, a second photoresist layer 56 is formed on the first photoresist layer 52 and the first conductive layer 120, and is patterned to form several second openings 58 exposing a portion of the first conductive layer 120. A second conductive layer 130 is formed in the second openings 58. Then, the first photoresist layer 52 and the second photoresist layer 56 are removed. As indicated in FIGS. 5E and 5F, the second photoresist layer 56 formed on the conductive substrate 50 by way of spin coating is patterned by processes such as baking, exposure, and development, so that the second photoresist layer 56 has several second openings 58. As indicated in FIG. 5G, the second conductive layer 130 formed in the second openings 58 by way of electroplating is preferably formed by copper, nickel, gold or a combination thereof. The second conductive layer 130 directly contacts the first conductive layer 120, and the second conductive layer 130 and the first conductive layer 120 are stacked together in a top down manner to form an interconnection wire structure. As indicated in FIG. 5H, the first photoresist layer 52 and the second photoresist layer 56 are removed by a de-photoresist agent (such as acetone) to expose the first conductive layer 120 and the second conductive layer 130 which are mutually stacked. Although the present embodiment only illustrates the first conductive layer 120 and the second conductive layer 130, a conductive layer with more than two layers can also be formed, and it does not impose any further restrictions on the invention.

Next, referring to FIGS. 5I~5L, a dielectric layer 110 is formed on the conductive substrate 50, wherein the dielectric layer 110 covers the first conductive layer 120, the second conductive layer 130 and a portion of the conductive substrate 50. A portion of the dielectric layer 110 is removed and a surface of the second conductive layer 130 (that is, the second surface 132) is exposed from the bottom surface 114 of the dielectric layer 110 and has the same plane with the bottom surface 114 of the dielectric layer 110. Then, a third photoresist layer 60 is formed on the conductive substrate 50 and the dielectric layer 110, and is patterned to form a third opening 62 exposing a portion of the conductive substrate 50. As indicated in FIG. 5I, the dielectric layer 110 is formed on the conductive substrate 50 by way of transfer molding. That is, the liquid-state dielectric layer 110 is injected to the mold cavity, and then is baked and cured. The dielectric layer 110 can also be formed on the conductive substrate 50 by way of compression molding, and the semi-cured state dielectric layer 110 is then completely cured at a high temperature and shaped. As indicated in FIG. 5J, a portion of the dielectric layer 110 is removed by way of grinding and/or buffing, so that the second surface 132 of the second conductive layer 130 is exposed from the dielectric layer 110, and has the same plane with the bottom surface 114 of the dielectric layer 110. Besides, the second surface 132 of the second conductive layer 130 may be concaved to the bottom surface 114 of the dielectric layer 110 by way of etching as indicated in FIG. 2A for the convenience of ball implantation. As indicated in FIGS. 5K and 5L, the third photoresist layer 60 is formed on the conductive substrate 50 by way of slit die coating or dip coating, and then is patterned by processes such as baking, exposure, and development, so that the third photoresist layer 60 has a third opening 62.

Next, referring to FIGS. 5M~5P, a portion of the conductive substrate 50 is removed to form a fourth opening 51, and a surface of the first conductive layer 120 and the top surface 112 of the dielectric layer 110 are exposed in the fourth opening 51. The surface of the first conductive layer 120 has the same plane with the top surface 112 of the dielectric layer 110. The third photoresist layer 60 is removed. Then, a fourth photoresist layer 64 is formed on the conductive substrate 50, the dielectric layer 110, the first conductive layer 120 and the second conductive layer 130, and is patterned to form a fifth opening 66 exposing a portion of the surface of the first conductive layer 120. As indicated in FIG. 5M, the conductive substrate 50 is formed in the fourth opening 51 by way of wet etching, and only a fourth opening 51 is illustrated, and the non-etched portion of the conductive substrate 50 forms an annular reinforcing structure 53 connected to the peripheral of the dielectric layer 110. The annular reinforcing structure 53 surrounds the top surface 112 of the dielectric layer 110 to enhance the strength of the entire package substrate to avoid the package substrate being warped or deformed. Besides, the surface of the first conductive layer 120 can be completely etched and become concaved to the top surface 112 of the dielectric layer 110 as indicated in FIG. 2A. As indicated in FIG. 5N, the third photoresist layer 60 is removed by a de-photoresist agent (such as acetone) to expose the first conductive layer 120 and the second conductive layer 130 which are mutually stacked. As indicated in FIGS. 5O and 5P, the fourth photoresist layer 64 is formed by way of slit die coating or dip coating, and is patterned by processes such as baking, exposure, and development, so that the fourth photoresist layer 64 has several fifth openings 66. Moreover, a portion of the surface of the first conductive layer 120 exposed in the fifth opening 66 can be further etched to form a cavity 123 as indicated in FIG. 1A.

Next, referring to FIGS. 5Q~5S, a bonding pad 140 is formed in the fifth opening 66. The fourth photoresist layer 64 is removed. Then, a welding layer 150 covering a surface of the second conductive layer 130 is formed on the second conductive layer 130. As indicated in FIG. 5Q, the bonding pad 140 is formed in the fifth opening 66 by way of electroplating, wherein the bonding pad 140 is formed by a material selected from tin (Sn), copper (Cu), silver (Ag), nickel (Ni), palladium (Pd), gold (Au), or a combination thereof and is preferably formed by a reflowable soldering material. As indicated in FIG. 5R, the fourth photoresist layer 64 is removed by a de-photoresist agent (such as acetone) to expose the first conductive layer 120 and the second conductive layer 130 which are mutually stacked. As indicated in FIG. 5S, the welding layer 150 is formed on the second conductive layer 130 by way of electroless-plating or immersion, wherein the welding layer 150 is formed by a material selected from tin (Sn), copper (Cu), silver (Ag), nickel (Ni), palladium (Pd), gold (Au), or a combination thereof, or an organic solderability preservatives (OSP). Detailed descriptions of the manufacturing method of the package substrate 100 are disclosed above, and detailed descriptions of the manufacturing method for the semiconductor device 160 are disclosed below.

Referring to FIGS. 5T~5W, a semiconductor device 160 is disposed on the package substrate 100. The semiconductor device 160 has a conductive bump 162 connected to the bonding pad 140 and supported between the semiconductor device 160 and the package substrate 100. A underfill layer 170 is formed to encapsulate the peripheral of the conductive bumps 162. A sealant layer 180 is formed to encapsulate the peripheral of both the semiconductor device 160 and the underfill layer 170. As indicated in FIG. 5T, the semiconductor device 160 is realized by an integrated circuit element whose active surface has several conductive bumps 162 disposed thereon, and only three conductive bumps 162 are illustrated in the diagram, wherein one conductive bump 162 corresponds to one bonding pad 140. In comparison to the bonding pad 140, the conductive bumps 162 have a higher melting point, and are realized by such as copper columns, copper bumps, gold bumps or stud bumps having a predetermined height, and the bonding pad 140 is realized by such as a reflowable soldering material. As indicated in FIGS. 5U and 5V, the underfill layer 170 is firstly formed on the package substrate 100, and then the conductive bumps 162 of the semiconductor device 160 passes the underfill layer 170 having lower fluidity to be electrically connected to the bonding pad 140 disposed under the underfill layer 170, so that the underfill layer 170 encapsulates the peripheral of the conductive bumps 162. Apart from the above method for forming the underfill layer 170, the underfill layer 170 can also be formed according to another method. For example, the semiconductor device 160 is firstly disposed on the package substrate 100, and then the underfill layer 170 having better fluidity is interposed into the gap between the semiconductor device 160 and the package substrate 100 to encapsulate the peripheral of the conductive bumps 162. As indicated in FIG. 5V, when the conductive bumps 162 is connected to the bonding pad 140, as indicated in FIGS. 1A and 2A, the bonding pad 140 is preferably confined within a cavity 123 and cannot move around to avoid the short-circuit due to bridging of the bonding pad 140 when the bonding pad is reflowed at a high temperature. As indicated in FIG. 5W, the sealant layer 180 is preferably formed by way of transfer molding, and is baked at a high temperature and cured. Besides, the sealant layer 180 can also expose the top surface 112 of the semiconductor device 160 as indicated in FIG. 4B to increase the heat dissipation area of the semiconductor device 160.

Next, referring to FIGS. 5X~5Y, a solder ball 190 is formed on the welding layer 150, and the package substrate 100 and the sealant layer 180 are divided to form several package structures for the semiconductor devices 160. As indicated in FIG. 5X, several solder balls 190 are formed on the welding layer 150, wherein each solder ball 190 is correspondingly connected to a welding layer 150 and can be formed by a leadless solder paste or a lead solder paste. As indicated in FIG. 5X, two package structures 101 for the semiconductor device, such as chip scale package structure, are divided by a cutting tool along a singulation line L, and the annular reinforcing structure 53 is dispensed with so that the volume of the package can be reduced.

FIGS. 6A and 6B respectively are a top view of package substrate 200 and a cross-sectional view along a cross-sectional line A-A according to an embodiment of the invention. FIGS. 7A and 7B respectively are a top view of package substrate 200 and a cross-sectional view along a cross-sectional line B-B according to another embodiment of the invention. As indicated in FIGS. 6A and 6B, the package substrate 200 comprises an annular reinforcing structure 202 and four package units 204. The annular reinforcing structure 202 has four openings 205 separated by ribs 203, and each opening 205 correspondingly exposes a package unit 204. Each package unit 204 is divided into 12 device blocks 206, for example, which are encapsulated by the dielectric layer 210, and the peripheral of the package units 204 are connected to each other by ribs 203 to avoid the package units being warped or deformed. In addition, as indicated in FIGS. 7A and 7B, the annular reinforcing structure 202 has a larger opening 207 correspondingly exposing four package units 204. Each package unit 204 is divided into 12 device blocks 206, for example. The 48 device blocks 206 together are encapsulated by the dielectric layer 210, and the outmost peripheral of the four package units 204 is connected to the annular reinforcing structure 202 to avoid the package units being warped or deformed.

Figure 8A:
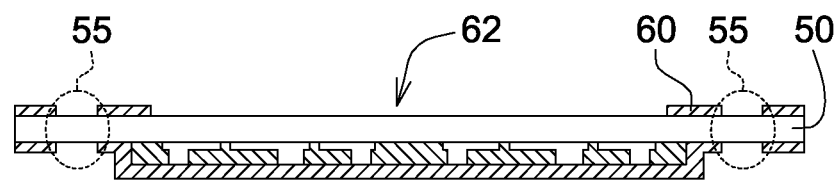
FIGS. 8A and 8B are processes of forming a positioning hole on an annular reinforcing structure.
Figure 8B:
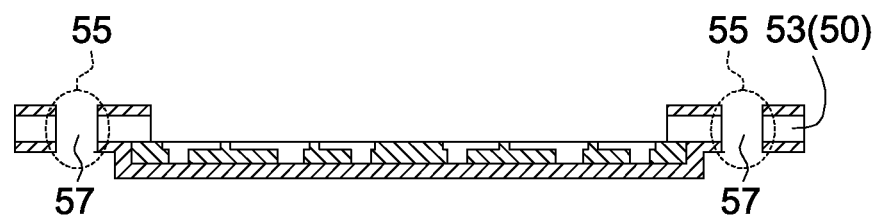

Referring to FIGS. 8A and 8B, processes of forming a positioning hole on an annular reinforcing structure 53 are shown. When the third photoresist layer 60 is formed on the conductive substrate 50, the third opening 62 exposes the middle part of the conductive substrate 50 as well as a portion of the outer side 55 of the conductive substrate 50. The outer side 55 is removed by way of etching to form a positioning hole 57 in the annular reinforcing structure 53. In the present embodiment, the positioning hole 57 can be used as a reference point for positioning the semiconductor device 160 (referring to FIG. 5T). The positioning hole 57 can also be formed on the outer side 55 of the conductive substrate 50 before the first photoresist layer 52 is formed (referring to FIG. 5A), and it does not impose further restrictions on the invention.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A package substrate, comprising:
   a dielectric layer having a top surface and a bottom surface; and
   a first conductive layer embedded in the dielectric layer between the top surface and the bottom surface of the dielectric layer and having a first surface substantially parallel to the top surface of the dielectric layer, wherein the first conductive layer comprises at least one cavity on a selected portion of the first surface such that sidewalls of the cavity are defined by the first conductive layer and the dielectric layer, and remaining portions of the first surface of the first conductive layer are completely exposed on the top surface of the dielectric layer.

2. The package substrate according to claim 1, further comprising a bonding pad disposed in the cavity of the first conductive layer and embedded in the first conductive layer, wherein the periphery of the bonding pad is confined by the sidewalls of the cavity.

3. The package substrate according to claim 1, wherein the first surface of the first conductive layer has the same plane with the top surface of the dielectric layer or is concaved to the top surface of the dielectric layer.

4. A package substrate, comprising:
   a dielectric layer having a top surface and a bottom surface;
   a first conductive layer embedded in the dielectric layer between the top surface and the bottom surface of the dielectric layer and having a first surface substantially parallel to the top surface of the dielectric layer, wherein the first surface of the first conductive layer is completely exposed at the top surface of the dielectric layer and is concave with respect to the top surface of the dielectric layer;
   at least one bonding pad disposed on a selected portion of the first surface of the first conductive layer, wherein the bonding pad is confined by the sidewalls of the concave portion at the top surface of the dielectric layer.

5. The package substrate according to claim 1 or 4, further comprising a plurality of conductive layers embedded in the dielectric layer between the top surface and the bottom surface of the dielectric layer, wherein the plurality of conductive layers includes the first conductive layer and is stacked together in a top down manner to form an interconnection structure connecting the top surface of the dielectric layer to the bottom surface of the dielectric layer.

6. The package substrate according to claim 1 or 4, further comprising an reinforcing structure connected to the periphery of the dielectric layer, wherein the reinforcing structure has at least an opening exposing the top surface of the dielectric layer and the first surface of the first conductive layer.

7. The package substrate according to claim 2 or 4, wherein the bonding pad is formed of a reflowable solder.

8. The package substrate according to claim 7, wherein the reflowable solder melts at an elevated temperature and is substantially confined within the cavity or the concave portion.

9. A package structure, comprising:
a dielectric layer having a top surface and a bottom surface;
a first conductive layer embedded in the dielectric layer between the top surface and the bottom surface of the dielectric layer and having a first surface substantially parallel to the top surface of the dielectric layer, wherein the first conductive layer comprises at least one cavity on a selected portion of the first surface of the first conductive layer such that sidewalls of the cavity are defined by the first conductive layer and the dielectric layer, and the remaining portions of the first surface of the first conductive layer are completely exposed on the top surface of the dielectric layer;
and
a semiconductor device disposed on the top surface of the dielectric layer and having at least one conductive bump connected to the first conductive layer, wherein the conductive bump corresponds to the cavity of the first conductive layer.

10. The package structure according to claim 9, wherein the conductive bump comprises a copper column and a solder pad, and the solder pad is substantially confined within the cavity of the first conductive layer.

11. The package structure according to claim 9, wherein the package substrate further comprises a bonding pad disposed in the cavity of the first conductive layer and embedded in the first conductive layer, the periphery of the bonding pad being confined by the sidewalls of the cavity.

12. The package structure according to claim 11, wherein the conductive bump is connected to the bonding pad in the cavity of the first conductive layer.

13. The package structure according to claim 9, wherein the first surface of the first conductive layer of the package substrate has the same plane with the top surface of the dielectric layer or is concave with respect to the top surface of the dielectric layer.

14. A package structure, comprising:
a dielectric layer having a top surface and a bottom surface;
a first conductive layer embedded in the dielectric layer between the top surface and the bottom surface of the dielectric layer and having a first surface substantially parallel to the top surface of the dielectric layer, wherein the first surface of the first conductive layer is completely exposed at the top surface of the dielectric layer and a portion thereof is concave with respect to the top surface of the dielectric layer;
at least one bonding pad disposed on a selected portion of the first surface of the first conductive layer, wherein the bonding pad is confined by sidewalls of the concave portion at the top surface of the dielectric layer; and
a semiconductor device disposed on the top surface of the dielectric layer and having at least one conductive bump connected to the first conductive layer, wherein the conductive bump corresponds to the bonding pad of the first conductive layer.

15. The package structure according to claim 9 or 14, wherein the package substrate further comprising a plurality of conductive layers embedded into the dielectric layer between the top surface and the bottom surface of the dielectric layer, wherein the plurality of conductive layers includes the first conductive layer and is stacked together in a top down manner to form an interconnection structure connecting the top surface of the dielectric layer to the bottom surface of the dielectric layer.

16. The package structure according to claim 11 or 14, wherein the conductive bump comprises a copper column.

17. The package structure according to claim 16, wherein the conductive bump further comprising a solder pad on the copper column.

18. The package structure according to according to claim 11 or 14, wherein the bonding pad is formed of a reflowable solder.

19. The package structure according to claim 18, wherein the reflowable solder melts at an elevated temperature and is substantially confined within the cavity or the concaved portion.

* * * * *